US008381678B2

(12) United States Patent
Tsai et al.

(10) Patent No.: US 8,381,678 B2
(45) Date of Patent: Feb. 26, 2013

(54) WIDE AREA ATMOSPHERE PRESSURE PLASMA JET APPARATUS

(75) Inventors: Chen-Der Tsai, Hsinchu County (TW); Wen-Tung Hsu, Hsinchu County (TW); Chin-Jyi Wu, Kaohsiung (TW); Chih-Wei Chen, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 548 days.

(21) Appl. No.: 12/501,557

(22) Filed: Jul. 13, 2009

(65) Prior Publication Data

US 2010/0164353 A1 Jul. 1, 2010

(30) Foreign Application Priority Data

Dec. 31, 2008 (TW) ............................... 97151854 A

(51) Int. Cl.
*C23C 16/50* (2006.01)
*C23F 1/00* (2006.01)
*H01L 21/306* (2006.01)
*H01J 7/24* (2006.01)

(52) U.S. Cl. ........... 118/723 E; 156/345.43; 315/111.21

(58) Field of Classification Search .................. 118/715, 118/722, 723 R, 723 E; 156/345.43, 345.44, 156/345.45, 345.46, 345.47; 315/111.21
See application file for complete search history.

(56) References Cited

U.S. PATENT DOCUMENTS

| | | | | |
|---|---|---|---|---|
| 6,265,690 | B1 | 7/2001 | Fornsel et al. | |
| 6,936,546 | B2 * | 8/2005 | Robbins | 438/707 |
| 2008/0032063 | A1 * | 2/2008 | Chang et al. | 427/578 |

FOREIGN PATENT DOCUMENTS

| | | |
|---|---|---|
| JP | 63-239800 | 10/1988 |
| JP | 3069271 | 2/1997 |
| JP | 09-115692 | 5/1997 |
| JP | 11-104842 | 4/1999 |
| JP | 2002-500818 | 1/2002 |
| JP | 2004-052045 | 2/2004 |
| JP | 2008-182176 | 8/2008 |
| TW | I270913 | 1/2007 |

OTHER PUBLICATIONS

English Abstract of TW I270913.
Taiwanese language Notice of Allowance dated Mar. 6, 2012.

(Continued)

*Primary Examiner* — Maureen Gramaglia
(74) *Attorney, Agent, or Firm* — McClure, Qualey & Rodack, LLP

(57) ABSTRACT

A wide area atmospheric pressure plasma jet apparatus including a transmission mechanism, a plasma housing and two plasma-generating devices is provided. The transmission mechanism includes a rotation output end that has a center axis. The plasma housing has an opening. The plasma housing further has a air-attracting hole near the rotation output end and extended from an outer wall of the plasma housing to the interior of the plasma housing, so that the heat of the plasma housing can be dissipated due to the generated gas circulation. The plasma-generating devices are disposed within the plasma housing and connected with the rotation output end. Each of the plasma-generating devices has a plasma nozzle located at the opening and tilts from the center axis. When the rotation output end drives the plasma-generating devices to rotate, two plasma beams are obliquely ejected from the plasma nozzle and the plasma processing area is increased.

7 Claims, 2 Drawing Sheets

OTHER PUBLICATIONS

English language translation of abstract of JP 63-239800 (published Oct. 5, 1988).

English language translation of abstract of JP 3069271 (published Feb. 4, 1997).

English language translation of abstract of JP 09-115692 (published May 2, 1997).

English language translation of abstract of JP 11-104842 (published Apr. 20, 1999).

English language translation of JP 2002-500818 (published Jan. 8, 2002).

English language translation of abstract of JP 2004-052045 (published Feb. 19, 2004).

English language translation of abstract of JP 2008-182176 (published Aug. 7, 2008).

* cited by examiner

WIDE AREA ATMOSPHERE PRESSURE PLASMA JET APPARATUS

This application claims the benefit of Taiwan application Serial No. 97151854, filed Dec. 31, 2008, the subject matter of which is incorporated herein by reference.

BACKGROUND OF THE INVENTION

1. Field of the Invention

The invention relates in general to an atmospheric pressure plasma jet apparatus, and more particularly to a wide area atmospheric pressure plasma jet apparatus.

2. Description of the Related Art

Atmospheric pressure plasma refers to the plasma generated at an atmospheric pressure or near an atmospheric pressure. Compared with the conventional vacuum plasma technology, the atmospheric pressure plasma system is definitely advantaged in terms of cost. In terms of equipment cost, the expensive and heavy vacuum equipment is not required. In terms of manufacturing process, the work piece is not restricted by the vacuum cavity, and continuous type manufacturing process is applicable. The technical features effectively reduce manufacturing cost, and the system can be configured in small and portable equipment according to actual needs, hence making the area of application wider.

Atmospheric pressure plasma is generated by driving an electric field between two electrodes at normal atmospheric pressure, wherein plasma is generated when the gas between the electric field avalanches and becomes dissociated. There are different types of plasma source and design which can be classified as corona discharge, dielectric barrier discharge, plasma jet and plasma torch according to the form of plasma. Plasma jet is advantaged by having concentrated energy and fast processing speed. However, under the requirement of large-sized area, to process the surface treatment of the work piece by way of atmospheric pressure plasma and at the same time meet the requirements of low temperature and fast speed, normally multiple plasma-generating devices are used. As the cost of multiple plasma-generating devices is relatively high, many manufacturers withdraw from employing multiple plasma-generating devices due to cost benefit consideration.

Currently, the effect of large area plasma processing is normally achieved by dielectric barrier discharge technology. Despite dielectric barrier discharge technology is capable of processing a large area, there are many problems such as lower processing rate (due to weaker power) and discharge of equipment, therefore the system and the work piece are very close to each other, and the gap therebetween must be as small as a few millimeters. Besides, as the manufacturing equipment is easily over-heated, the manufacturing process of dielectric barrier discharge technology is not applicable to many polymer materials.

Furthermore, the plasma cleaning mechanism mainly uses the chemical reaction between the electrons or ions of plasma and the surface of the base material. However, is will cause to etch the surface and there are micro-particles left on the surface after cleaning process, and affect subsequent manufacturing process.

SUMMARY OF THE INVENTION

The invention is directed to a wide area atmospheric pressure plasma jet apparatus. By the design of an angle of inclination, wide area processing is achieved. Appropriate design of gas circulation in the apparatus effectively removes micro-particles, avoids the apparatus being over-heated, increases product coformidity rate and prolongs the lifespan of the apparatus.

According to a first aspect of the present invention, a wide area atmospheric pressure plasma jet apparatus is provided. The wide area atmospheric pressure plasma jet apparatus includes a transmission mechanism, a plasma housing and two plasma-generating devices. The transmission mechanism includes a rotation output end that has a center axis. The plasma housing has an opening, wherein the rotation output end is disposed opposite the opening. The plasma housing further has a air-attracting hole near the rotation output end and extended from an outer wall of the plasma housing to the interior of the plasma housing, so that the heat of the plasma housing can be dissipated due to gas circulation generated by the air-attracting hole and the opening. The plasma-generating devices are disposed within the plasma housing and connected with the rotation output end. Each of the plasma-generating devices has a plasma nozzle located at the opening and tilts from the center axis. When the rotation output end drives the plasma-generating devices to rotate, the plasma-generating devices rotate around the center axis at an angle of inclination so that two plasma beams are obliquely ejected from the plasma nozzles and that the plasma processing area is increased.

The invention will become apparent from the following detailed description of the preferred but non-limiting embodiments. The following description is made with reference to the accompanying drawings.

DETAILED DESCRIPTION OF THE INVENTION

Figure 1:
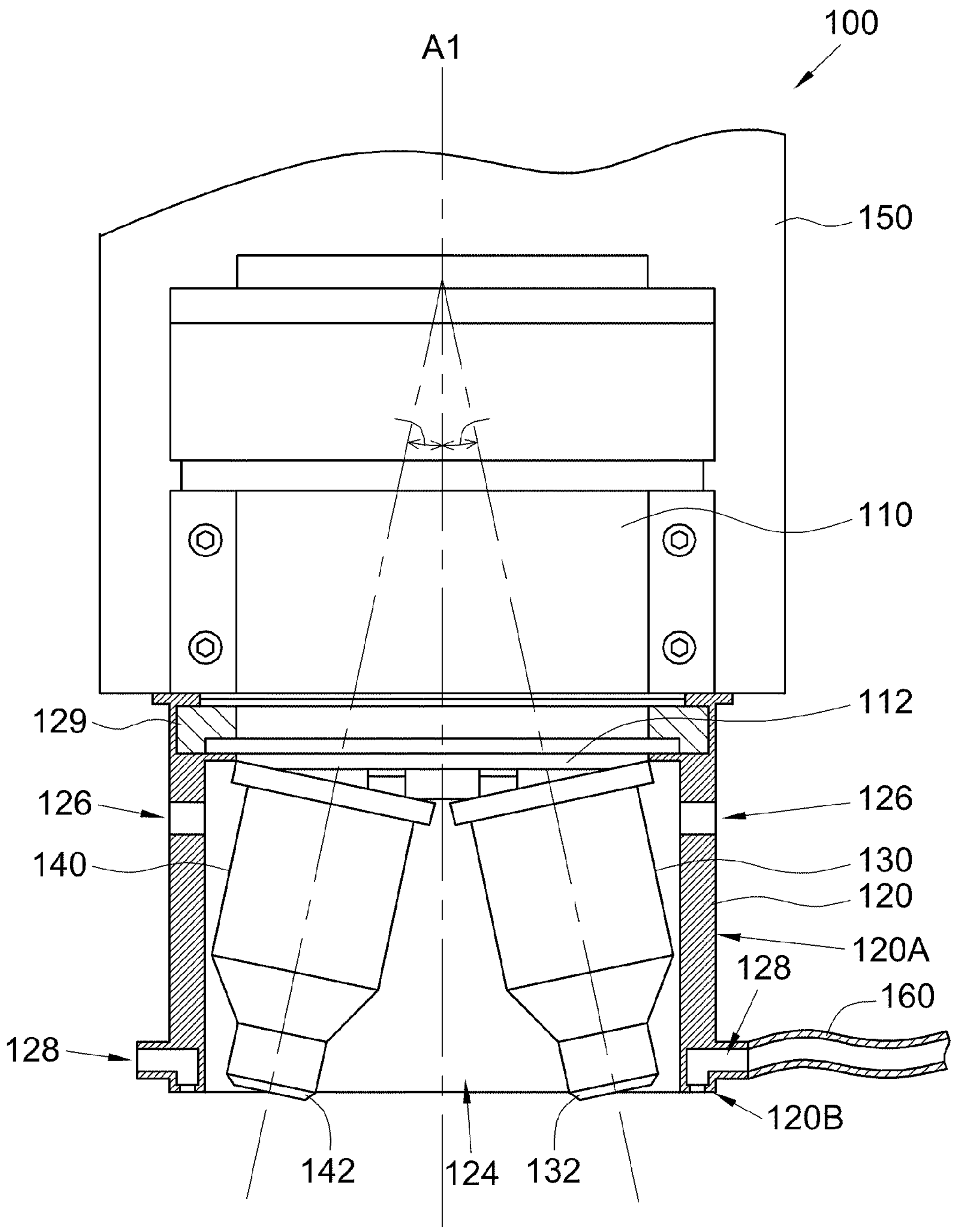
FIG. 1 shows a wide area atmospheric pressure plasma jet apparatus according to a preferred embodiment of the invention.

Referring to FIG. 1, a wide area atmospheric pressure plasma jet apparatus according to a preferred embodiment of the invention is shown. As indicated in FIG. 1, the wide area atmospheric pressure plasma jet apparatus 100 includes a transmission mechanism 110, a plasma housing 120 and two plasma-generating devices 130 and 140. The transmission mechanism 110 is disposed on a base 150 for example and includes a rotation output end 112 that has a center axis A1. The transmission mechanism 110, for example, has a power source and at least one transmission element, wherein the power source is connected with the transmission element and provides power to the elements of the wide area atmospheric pressure plasma jet apparatus 100, and the transmission element drives the plasma-generating devices 130 and 140 to rotate. In the present embodiment of the invention, the power source can be a direct current motor, an alternate current motor or a pneumatic rotation cylinder, and the transmission element can be a belt, a gear set or a chain.

The plasma housing 120 has an opening 124, wherein the rotation output end 112 is disposed opposite the opening 124. The plasma housing 120 further has an air-attracting hole 126 near the rotation output end 112 and extended from an outer wall 120A of the plasma housing 120 to the interior of the plasma housing 120. The heat of the plasma housing 120 can be dissipated due to gas circulation generated by the air-attracting hole 126 and the opening 124.

The plasma housing 120 further has an air-extracting hole 128 near the opening 124 and extended from the outer wall 120A to a side edge 120B. The wide area atmospheric pressure plasma jet apparatus 100 further includes a suction unit 160 connected with the air-extracting hole 128 for extracting gas from the air-extracting hole 128.

Two plasma-generating devices 130 and 140 are disposed within the plasma housing 120 and connected with the rotation output end 112. The two plasma-generating devices 130 and 140 respectively have two plasma nozzles 132 and 142 located at the opening 124. Besides, each of the two plasma-generating devices 130 and 140 tilts to an angle from the center axis A1, and when the rotation output end 112 drives the plasma-generating devices 130 and 140 to rotate, the plasma-generating devices 130 and 140 rotate around the center axis A1 at a particular angle of inclination. Normally, there are gases blown towards plasma nozzles 132 and 142 in the plasma-generating devices 130 and 140 to help dissipating plasma gas and generate two plasma beams.

The two plasma-generating devices 130 and 140 preferably are symmetrically disposed with respect to the center axis A1 and have the same angle of inclination. The plasma-generating devices 130 and 140 tilt from the center axis A1 to an angle θ of about 1-30 degrees so as to generate different plasma processing areas.

The plasma-generating devices 130 and 140 are obliquely disposed. When the plasma-generating devices 130 and 140 generate plasma gases and the plasma-generating devices 130 and 140 are driven to rotate, the plasma beams are obliquely ejected from the plasma nozzles 132 and 142 so that plasma processing area is increased.

Preferably, the plasma housing 120 further has a bearing element 129 for connecting the rotation output end 112 with the plasma-generating devices 130 and 140, so that the rotation output end 112 can more smoothly and steadily drives the plasma-generating devices 130 and 140 to rotate.

Figure 2:
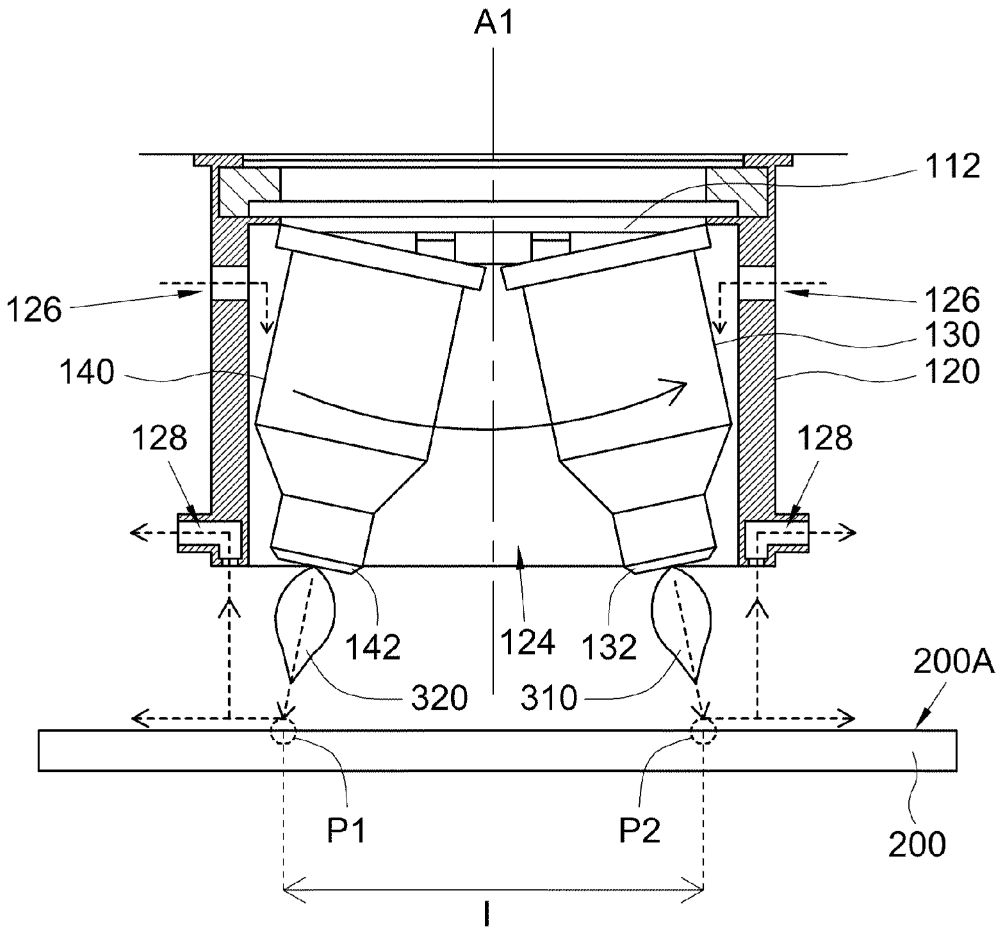
FIG. 2 shows a partial view of the wide area atmospheric pressure plasma jet apparatus of FIG. 1 during operation.

Referring to FIG. 2, a partial view of the wide area atmospheric pressure plasma jet apparatus of FIG. 1 during operation is shown. When the wide area atmospheric pressure plasma jet apparatus 100 processes the surface 200A of an object 200 being a to-be-processed work piece, the rotation output end 112 drives the plasma-generating devices 130 and 140 to rotate around the center axis A1. Meanwhile, the plasma beams 310 and 320 are obliquely ejected from the plasma nozzles 132 and 142 and projected on the surface 200A of the object 200, so that the area for plasma processing is about the size of the region I defined by two positions P1 and P2 on the surface 200A crossing over two plasma beams 310 and 320.

Compared with the conventional plasma processing apparatus which fixes the plasma nozzle at the central position, the wide area atmospheric pressure plasma jet apparatus 100 of the present embodiment of the invention has a wider area of plasma processing and is more suitable for processing a processing a large-sized surface of an object.

As indicated in FIG. 2, the plasma-generating devices 130 and 140 are obliquely disposed. When the plasma-generating devices 130 and 140 are driven by the rotation output end 112 to rotate, the plasma-generating devices 130 and 140 generate a fan-like guiding effect. Meanwhile, the rotation output end 112 generates a sucking force, so that the gas outside the plasma housing 120 is infused to the plasma housing 120 through the air-attracting hole 126, and is drawn by the plasma-generating devices 130 and 140 and leaves the plasma housing 120 through the opening 124 of the plasma nozzles 132 and 142. Thus, gas is circulated between the interior and the exterior of the plasma housing 120.

The plasma-generating devices 130 and 140 keep generating heat during the generation of plasma, and the heat generated is easily accumulated on the plasma housing 120 and the casing (not illustrated) of the plasma-generating devices 130 and 140. In the present embodiment of the invention, the heat of the plasma housing 120 can be timely dissipated due to the gas circulation generated by the air-attracting hole 126 and the opening 124 and the plasma-generating devices 130 and 140 being obliquely disposed, so as to avid the apparatus being over-heated and prolong the lifespan of the wide area atmospheric pressure plasma jet apparatus of the present embodiment of the invention.

Let FIG. 2 be taken for example again. When the plasma beams 310 and 320 process the surface 200A of the object 200, there are micro-particles generated due to the chemical reaction between active molecules (such as electrons or ions) of the plasma beams 310 and 320 and the surface 200A of the object 200. The suction unit 160 (illustrated in FIG. 1) is connected with the air-extracting hole 128. When the gases of the plasma beams 310 and 320 are blown outwards, the mechanism of the suction unit 160 for extracting the gas is activated. Meanwhile, the suction unit 160 extracts the air-extracting hole 128 these unnecessary micro-particles, so the amount of the micro-particles is reduced. Thus, the wide area atmospheric pressure plasma jet apparatus 100 of the present embodiment of the invention is capable of increasing product coformidity rate.

Despite the wide area atmospheric pressure plasma jet apparatus 100 is exemplified by two plasma-generating devices in the present embodiment of the invention, the invention is not limited to the above exemplification. Multiple plasma-generating devices can be disposed on the apparatus according to actual needs. Furthermore, no restriction is imposed on the numbers of the air-attracting hole 126 and the air-extracting hole 128 disposed on the plasma housing 120 of the wide area atmospheric pressure plasma jet apparatus 100. Preferably, the air-attracting holes and the air-extracting holes are uniformly distributed on the plasma housing 120, so that the heat is more evenly dissipated by the circulation of gas and micro-particles are extracted at the same time.

According to the wide area atmospheric pressure plasma jet apparatus disclosed in the above embodiment of the invention, the plasma-generating devices are obliquely disposed, and the plasma-generating devices rotate around the center axis at an angle of inclination when processing the surface of an object. Meanwhile, as the angle of inclination is extended outwards, the area projected by the plasma beam will increase, so that the plasma area becomes wider and the plasma processing area is increased accordingly. The wide area atmospheric pressure plasma jet apparatus of the present embodiment of the invention increases the benefit of processing treatment by 50%. Besides, the plasma-generating devices being obliquely disposed enable the plasma gases to be blown outwardly automatically and achieve surface treatment and cleaning without incurring pollution during the cleaning process. The wide area atmospheric pressure plasma jet apparatus of the present embodiment of the invention has a well-designed mechanism of gas circulation, which directly dissipates the heat generated during the operation of the apparatus and avoids the apparatus being over-heated. Thus, the apparatus will not break down unexpectedly due to overheating, hence further increasing the lifespan and economic benefit of the apparatus.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A wide area atmospheric pressure plasma jet apparatus, comprising:

a transmission mechanism comprising a rotation output end that has a center axis;

a plasma housing having an opening, wherein the rotation output end is disposed opposite to the opening, the plasma housing further has an air-attracting hole near the rotation output end and extended from an outer wall of the plasma housing to the interior of the plasma housing; and two plasma-generating devices disposed within the plasma housing and connected with the rotation output end, wherein each of the plasma-generating devices has a plasma nozzle located at the opening, and tilts from the center axis to an angle, and when the rotation output end drives the plasma-generating devices to rotate, the plasma-generating devices rotate around the center axis at a particular angle of inclination so that two plasma beams are obliquely ejected from plasma nozzles and toward a direction away from the center axis and that the plasma processing area is increased;

wherein an air outside the plasma housing is infused into the inside of the plasma housing through the air-attracting hole by a differential pressure between the inside and the outside of the plasma housing, which is generated by rotation of the plasma-generating devices and the air is discharged through the opening to the outside of the plasma housing by the rotation of the plasma-generating devices, so that the heat inside the plasma housing is dissipated by a circulation of the air.

2. The wide area atmospheric pressure plasma jet apparatus according to claim 1, wherein the angle to which the plasma-generating devices tilt from the center axis ranges from 1 degrees to 30 degrees.

3. The wide area atmospheric pressure plasma jet apparatus according to claim 1, wherein the plasma-generating devices are symmetric with respect to the center axis.

4. The wide area atmospheric pressure plasma jet apparatus according to claim 1, wherein the plasma housing further has an air-extracting hole near the opening.

5. The wide area atmospheric pressure plasma jet apparatus according to claim 4, further comprising a suction unit connected with the air-extracting hole.

6. The wide area atmospheric pressure plasma jet apparatus according to claim 1, wherein the transmission mechanism has a power source and at least one transmission element, the power source connects with the at least one transmission element, and the rotation output end connects with the at least one transmission element.

7. The wide area atmospheric pressure plasma jet apparatus according to claim 1, wherein the plasma housing further has a bearing element used for connecting the rotation output end with the plasma-generating devices.

* * * * *

UNITED STATES PATENT AND TRADEMARK OFFICE

CERTIFICATE OF CORRECTION

PATENT NO. : 8,381,678 B2
APPLICATION NO. : 12/501557
DATED : February 26, 2013
INVENTOR(S) : Tsai et al.

It is certified that error appears in the above-identified patent and that said Letters Patent is hereby corrected as shown below:

On the Title Page, Item (54) and in the Specification, Column 1, Line 1, the Title is amended by deleting "Atmosphere" and substituting therefore --Atmospheric--.

Signed and Sealed this
Twenty-sixth Day of November, 2013

Margaret A. Focarino

Margaret A. Focarino
*Commissioner for Patents of the United States Patent and Trademark Office*